US009960017B2

(12) United States Patent
Ikedo et al.

(10) Patent No.: US 9,960,017 B2
(45) Date of Patent: May 1, 2018

(54) PLASMA GAS JETTING DEVICE (71) Applicant: FUJI MACHINE MFG. CO., LTD., Chiryu-shi (JP)

(72) Inventors: Toshiyuki Ikedo, Nagoya (JP); Takahiro Jindo, Anjo (JP)

(73) Assignee: FUJI MACHINE MFG. CO., LTD., Chiryu-shi (JP)

( * ) Notice: Subject to any disclaimer, the term of this patent is extended or adjusted under 35 U.S.C. 154(b) by 0 days. days.

(21) Appl. No.: 15/510,448

(22) PCT Filed: Sep. 16, 2014

(86) PCT No.: PCT/JP2014/074367
§ 371 (c)(1),
(2) Date: Mar. 10, 2017

(87) PCT Pub. No.: WO2016/042595
PCT Pub. Date: Mar. 24, 2016

(65) Prior Publication Data
US 2017/0287679 A1    Oct. 5, 2017

(51) Int. Cl.
*B23K 10/00* (2006.01)
*H01J 37/32* (2006.01)

(52) U.S. Cl.
CPC .... *H01J 37/3244* (2013.01); *H01J 37/32834* (2013.01)

(58) Field of Classification Search
CPC ......... H05B 1/34; H05B 1/26; H01J 37/3244; H01J 37/32834
USPC ............... 219/121.5, 121.51, 121.48, 121.55
See application file for complete search history.

(56) References Cited

U.S. PATENT DOCUMENTS

| | | | | |
|---|---|---|---|---|
| 3,226,523 A | * | 12/1965 | Miller | B23K 10/02 219/69.1 |
| 5,120,930 A | * | 6/1992 | Sanders | B23K 10/00 219/121.48 |
| 6,268,583 B1 | * | 7/2001 | Yamaguchi | B23K 10/00 219/121.49 |

(Continued)

FOREIGN PATENT DOCUMENTS

| | | |
|---|---|---|
| JP | 7-62546 | 3/1995 |
| JP | 4871343 B2 | 2/2012 |
| JP | 2012-59548 A | 3/2012 |

(Continued)

OTHER PUBLICATIONS

International Search Report dated Dec. 2, 2014 in PCT/JP2014/074367 filed Sep. 16, 2014.

*Primary Examiner* — Mark Paschall
(74) *Attorney, Agent, or Firm* — Oblon, McClelland, Maier & Neustadt, L.L.P.

(57) ABSTRACT

Plasma gas is ejected from inner gas ejection ports that are formed in a downstream side housing, and nitrogen gas is supplied as protective gas to a protective gas source between a housing and a cover section. Nitrogen gas is sucked in accompanying exhaust from inner gas ejection ports of plasma gas, and is ejected from the outer gas ejection ports. In this case, since a layer of nitrogen gas is formed in the periphery of plasma gas, it is possible to make it difficult to bring the plasma gas into contact with air, and it is possible to make it difficult to react a reactive species such as a radical in the plasma gas, oxygen in the air, and the like.

8 Claims, 9 Drawing Sheets (56) References Cited

U.S. PATENT DOCUMENTS

2009/0230095 A1\* 9/2009 Liebold ................ B23K 9/296
 219/121.5
2014/0217069 A1\* 8/2014 Griffin ................ B23K 9/296
 219/121.5

FOREIGN PATENT DOCUMENTS

JP 2013-20836 A 1/2013
WO 2013/108797 A1 7/2013

\* cited by examiner

PLASMA GAS JETTING DEVICE

TECHNICAL FIELD

The present application relates to a plasma gas jetting device that jets plasma gas on a treatment target object in plasma treatment on the treatment target object.

BACKGROUND ART

In a plasma gas jetting device described in PTL 1, the periphery of an ejection port for plasma gas is covered by a shielding material, and the ejection port for inert gas is provided externally to the shielding material. Inert gas is jetted prior to and after jetting of the plasma gas on a treatment target object, and thereby, it is possible to improve plasma treatment effects. In addition, since inert gas is ejected on the periphery of the plasma gas, it is possible to make it difficult for the plasma gas to contact oxygen in the air.

In a plasma gas jetting device described in PTL 2, an ejection port for inert gas is provided externally to an ejection port for plasma gas, but an exhaust gas recovery passage is provided between the ejection port for plasma gas and the ejection port for inert gas. Exhaust gas and the like that is generated in plasma treatment is recovered through the exhaust gas recovery passage, but since inert gas is ejected externally to the exhaust gas recovery passage, emission of exhaust gas in the air is favorably suppressed.

PTL 3 describes a plasma treatment system that is connected to multiple plasma treatment devices using connecting sections. In the plasma treatment system, an air curtain is formed by supplying inert gas to respective connecting sections, and plasma treatment spaces partition each of the multiple plasma treatment devices.

CITATION LIST

Patent Literature

PTL 1: Japanese Patent No. 4871343
PTL 2: JP-A-7-062546
PTL 3: JP-A-2013-020836

SUMMARY

The problem solved is to improve a plasma gas jetting device and suppress lowering of plasma treatment capacity.

Solution to Problem and Advantageous Effects

In a plasma gas jetting device of the disclosure, plasma gas is ejected from a gas ejection port by protective gas coming together with the plasma gas as the plasma gas is ejected, and jetted on the treatment target object. It is difficult for the ejected plasma gas to come into contact with oxygen in the air, and it is difficult for a reactive species such as a radical and the like that is contained in the plasma gas to react with oxygen and the like in the air. As a result, it is possible to suppress lowering of plasma treatment capacity between discharge of the plasma gas from the plasma gas jetting device until jetting on the treatment target object.

In addition, since it is possible to suppress lowering of plasma treatment capacity, necessity to cause the plasma gas jetting device to approach the treatment target object is reduced. In other words, it is possible to favorably perform plasma treatment even if the plasma gas jetting device is separated from the treatment target object and the processing treatment is effective on the treatment target object that has a protruding portion on the surface.

The disclosure that is recognized to be claimable in the present application, feature points, or the like are described below.

(1) A plasma gas jetting device includes: a plasma gas ejection section that ejects plasma gas that is obtained by being activated in a discharge space from inner gas ejection ports that are provided in an inner housing; and a protective gas supply section that supplies the protective gas to a protective gas chamber between the inner housing and an outer housing that is provided in a state of covering at least a part of the inner housing, in which the plasma gas and the protective gas are ejected from outer gas ejection ports that are provided in the outer housing and jetted on the treatment target object.

As long as the outer housing covers at least the vicinity of a part in which the inner gas ejection ports of the inner housing are provided separated with gaps therebetween, the outer housing can be used and does not necessarily cover the entirety of the inner housing.

(2) The plasma gas jetting device according to (1), in which an opening area So of the outer gas ejection ports is larger than an opening area Si of the inner gas ejection ports.

A ratio γs (So/Si) with respect to the opening area So of the outer gas ejection port and the opening area Si of the inner gas ejection port is larger than 1 (γs>1).

(3) The plasma gas jetting device according to (1) or (2), in which the ratio γs (So/Si) with respect to the opening area So of the outer gas ejection ports and the opening area Si of the inner gas ejection ports is larger than 2 and smaller than 13.

It is desirable that the ratio γs (So/Si) is a larger value than 4 and a smaller value than 9. In a case where the number of outer gas ejection ports and the number of inner gas ejection ports are the same, it is possible for "opening areas" to be individual opening areas or the sum of opening areas of one or more ejection ports. In a case where the number of outer gas ejection ports and the number of inner gas ejection ports are different, it is possible to sum respective opening areas of the outer gas ejection ports and the inner gas ejection ports.

Note that, in a case where, for example, the outer gas ejection ports and the inner gas ejection ports are generally circular, and the numbers thereof are the same, it is possible to represent the relationship between the outer gas ejection ports and the inner gas ejection ports with a ratio γd (do/di) of diameters of individual ejection ports.

$$\gamma s = \gamma d^2$$

The ratio γd of the diameters, for example, is able to be a value that is larger than 1.5 and is smaller than 3.5, and a value larger than 2.0 and smaller than 3.0 is desirable.

(4) The plasma gas jetting device according to any one of (1) to (3), in which the outer gas ejection ports and the inner gas ejection ports are separated from each other in an up-down direction, and are provided in a state in which respective specified points that specify the ejection ports are positioned on the same straight line.

The specified points that specify the outer gas ejection ports and the inner gas ejection ports refer to representative points that represent the gas ejection ports. For example, in a case where the gas ejection ports are generally formed to be circular, it is possible to set center points of a circle. In addition, in a case where the gas ejection ports are not circular, it is possible to set center points in a longitudinal direction, set a substantial center point of an opening, and the like.

(5) The plasma gas jetting device according to any one of (1) to (4), in which the external gas ejection ports are provided at a downstream side in an ejection direction of the plasma gas that is ejected from the internal gas ejection ports.

The plasma gas that is ejected from the inner gas ejection ports is jetted on the treatment target object through the outer gas ejection ports. In other words, the plasma gas that is activated in a discharge space is jetted on the treatment target object through the inner gas ejection ports and the outer gas ejection ports.

(6) The plasma gas jetting device according to any one of (1) to (5), in which the inner housing includes (i) the discharge space and (ii) a plasma gas passage whose one end portion is set as a discharge side opening that is open to the discharge space and whose other end portion is set as the internal gas ejection port that is open to the protective gas chamber.

The plasma gas passage is not limited to one continuous passage, there may be multiple passages, and there may be a confluence, a branched portion, and the like of the multiple passages. In any case, all are generally referred to as a plasma passage.

(7) The plasma gas jetting device according to any one of (1) to (6), in which the protective gas supply section includes at least a pair of protective gas supply ports that are provided in a part facing the inner housing of each of both side faces of the outer housing.

In a case where the multiple inner gas ejection ports and the outer gas ejection ports, for example, are provided lined up in a width direction of the plasma gas jetting device, or in a case of being formed in a long slit shape in the width direction, the protective gas supply ports are respectively provided on both side faces on both sides of the outer housing in the width direction. In other words, it is desirable that the protective gas supply ports are provided at positions at which it is possible to supply the protective gas uniformly to a part between the inner gas ejection ports and outer gas ejection ports of the protective gas chamber.

(8) A plasma gas jetting device includes: a plasma gas ejection section that exhausts plasma gas that is obtained by being activated in a discharge space; and a protective gas supply section that is able to supply protective gas to a reduced pressure region that is generated by exhaust of the plasma gas, in which the plasma gas is ejected along with the protective gas from a gas ejection ports by the protective gas coming together with the plasma gas as the plasma gas is ejected, and jetted on the treatment target object.

It is possible for the technological characteristics according to any of (1) to (7) to be adopted in the plasma gas jetting device according to (8). In addition, it is possible to consider that the gas ejection ports according to (8) correspond to outer gas ejection ports according to (1).

DESCRIPTION OF EMBODIMENTS

Embodiments of the disclosure will be described below with reference to the drawings.

First Embodiment

Figure 1:
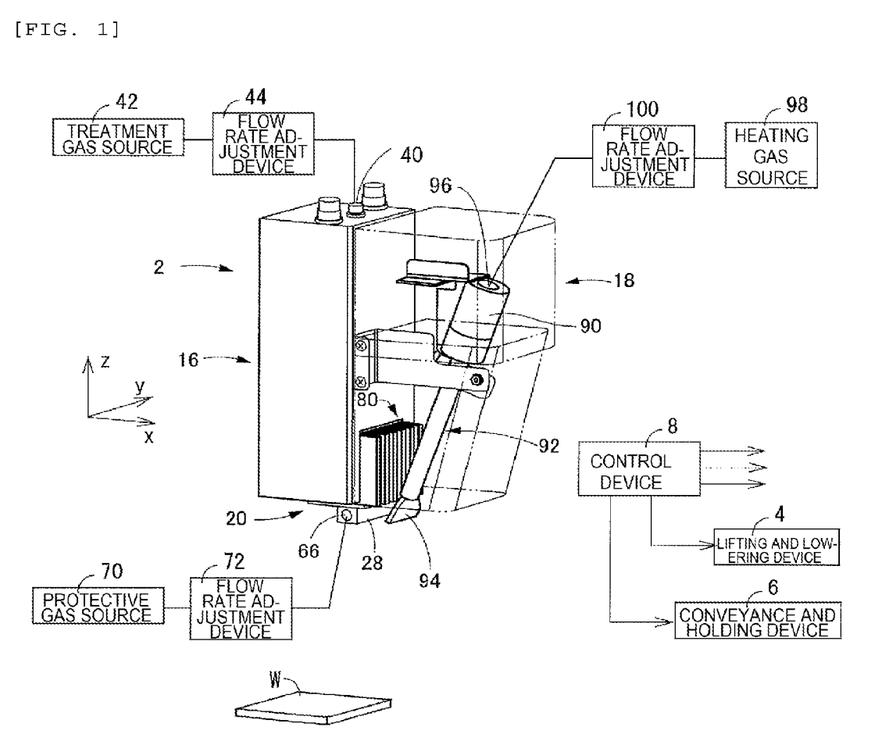
FIG. 1 is a perspective view conceptually illustrating a plasma treatment device that includes a plasma gas jetting device of a first embodiment of the disclosure.

FIG. 1 illustrates a plasma treatment device that includes a plasma gas jetting device that is an embodiment of the disclosure. The plasma treatment device includes (a) a plasma gas jetting device 2, (b) a lifting and lowering device 4 that lifts and lower a plasma treatment device main body that is not shown while holding the plasma gas jetting device 2, (c) a conveyance and holding device 6 that holds while conveying a treatment target object W, (d) a control device 8 that has a computer which controls the plasma treatment device as a main body, and the like. In FIG. 1, a conveyance direction (it is possible to refer to a front-back direction) of the treatment target object W is an x-direction, an up-down direction is a z-direction, and a width direction of the plasma gas jetting device 2 is a y-direction. The x-direction, the y-direction, and the z-direction are all orthogonal to one another.

Figure 2:
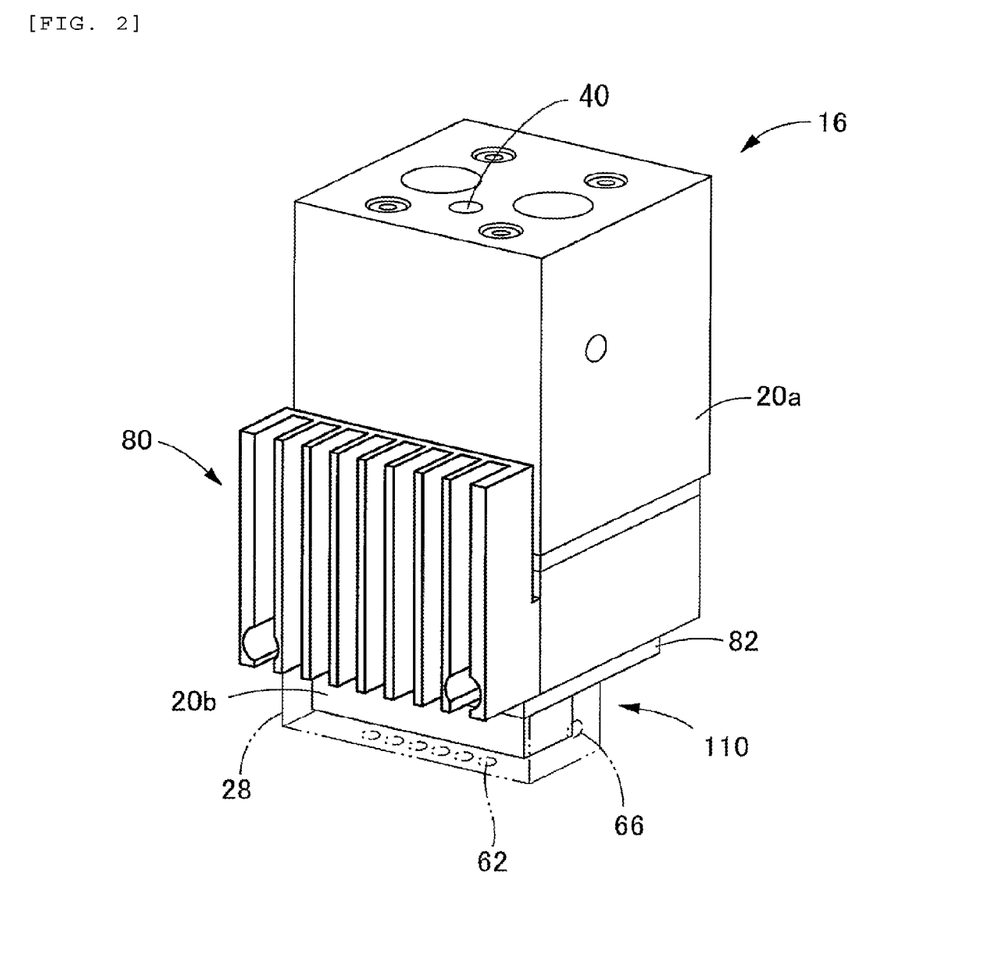
FIG. 2 is a perspective view of a part with a heating section of the plasma gas jetting device removed.
Figure 3:
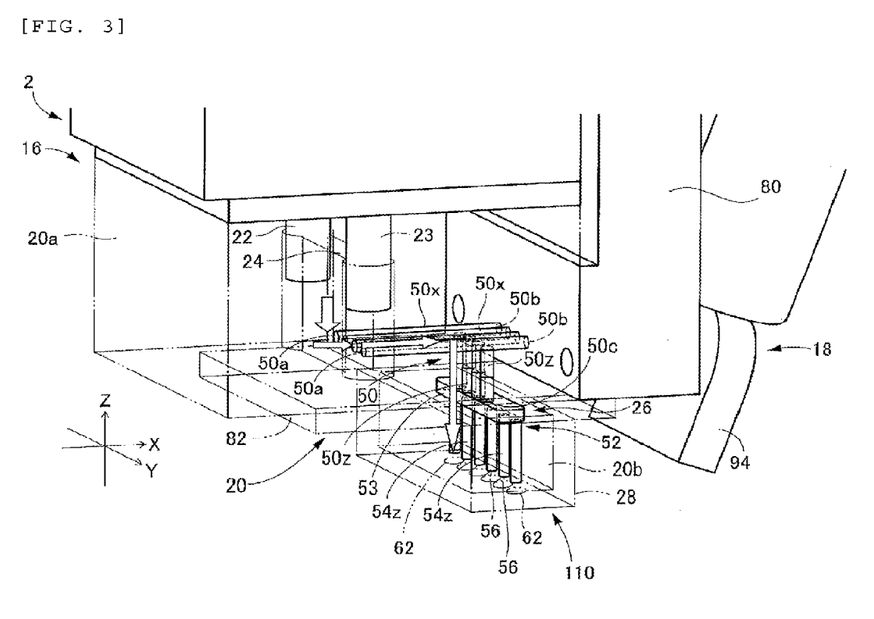
FIG. 3 is a perspective view illustrating a main portion of the plasma gas jetting device.

The plasma gas jetting device 2 includes a plasma gas generation and ejection section 16, a heating section 18, and the like indicated in FIG. 2. As shown in FIG. 3, the plasma gas generation and ejection section 16 includes (a) a housing 20 as an inner housing, (b) a pair of electrodes 22 and 23, (c) a space (a discharge space that is made by applying the pair of electrodes 22 and 23) 24 that is formed between the pair of electrodes 22 and 23, (d) a plasma gas passage 26, (e) a cover section 28 as an outer housing, and the like. The cover section 28 is provided separated with a gap in the housing 20.

The housing 20 includes an upstream side housing 20*a* and a downstream side housing 20*b*, and the downstream side housing 20*b* is attachable to and detachable from the upstream side housing 20*a*.

A treatment gas supply port 40 as shown in FIG. 1 is provided on an upper face of the upstream side housing 20a, and a treatment gas source 42 is connected via a flow rate adjustment device 44. Treatment gas includes reaction gas, carrier gas, and the like. Reaction gas is gas that is easily activated (for example, refers to reactive species such as radicals, positive ions, and negative ions; and is also able be referred to as plasma formation) in the discharge space 24, and for example, is equivalent to oxygen gas, hydrogen gas, and the like. Carrier gas is gas for transporting the reactive species, and gas that is difficult to be activated is commonly used. For example, carrier gas is equivalent to inert gas such as argon gas and helium gas, nitrogen gas, and the like.

The pair of electrodes 22 and 23 form the space 24 as shown in FIG. 3 in the upstream side housing 20a and are held facing the space 24.

Figure 6:
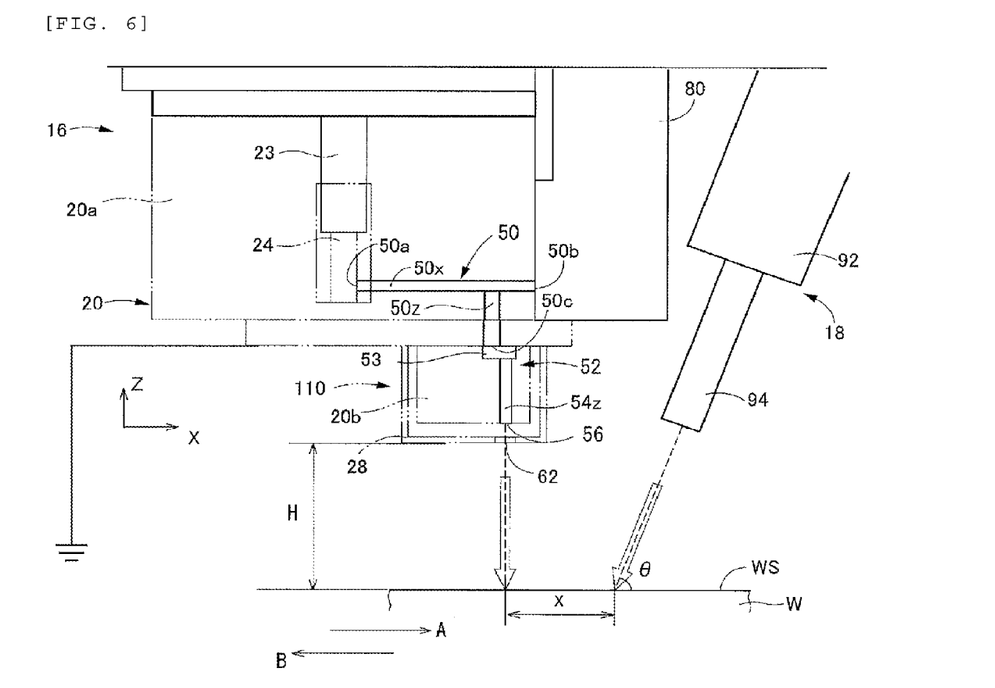
FIG. 6 is a side view of the main portion and a heating section.

As shown in FIGS. 3 and 6, the plasma gas passage 26 includes an upstream side passage 50 that is formed in the upstream side housing 20a and a downstream side passage 52 that is formed in the downstream side housing 20b.

The upstream side passage 50 includes multiple (four in the embodiment) x-passages 50x that extend in the x-direction and multiple (four in the embodiment) z-passages 50z that extend in the z-direction. Each of the four x-passages 50x and each of the four z-passages 50z are formed separately from each other in the y-direction. In addition, in each of the four x-passages 50x, one end portion is set as a discharge space opening 50a that is open to the discharge space 24 and the other end portion is set as an opening 50b which reaches a front face (yz-plane) of the upstream side housing 20a. Four z-passages 50z are respectively connected to each of the four x-passages 50x, and the downstream side end portion is set as an opening 50c that reaches the lower face (xy-plane) of the upstream side housing 20a.

As shown in FIGS. 3, 4A, 4B, 6, and the like, the downstream side passage 52 includes a connection recessed section 53 that is provided open to the upper face of the downstream side housing 20b (abutting surface of the upstream side housing 20a) and a plurality of ejection passages 54z (six in the embodiment) that are provided extending in the z-direction and separated from each other in the y-direction. The connection recessed section 53 is formed in a long hole shape extending in a y-direction, faces the opening 50c of the lower end portion of each of the four z-passages 50z described above in the upper opening of the connection recessed section 53, and the upper end portion of each of the six ejection passages 54z on the bottom face of the connection recessed section 53 is open. Accordingly, the z-passage 50z and the ejection passage 54z are connected via the connection recessed section 53. In addition, the lower end portion of the ejection passage 54z is set as an inner gas ejection port 56 that is open to reach the lower face (xy-plane) of the downstream side housing 20b. The inner gas ejection port 56 is generally formed to be circular, and is open toward the cover section 28.

Figure 4A:
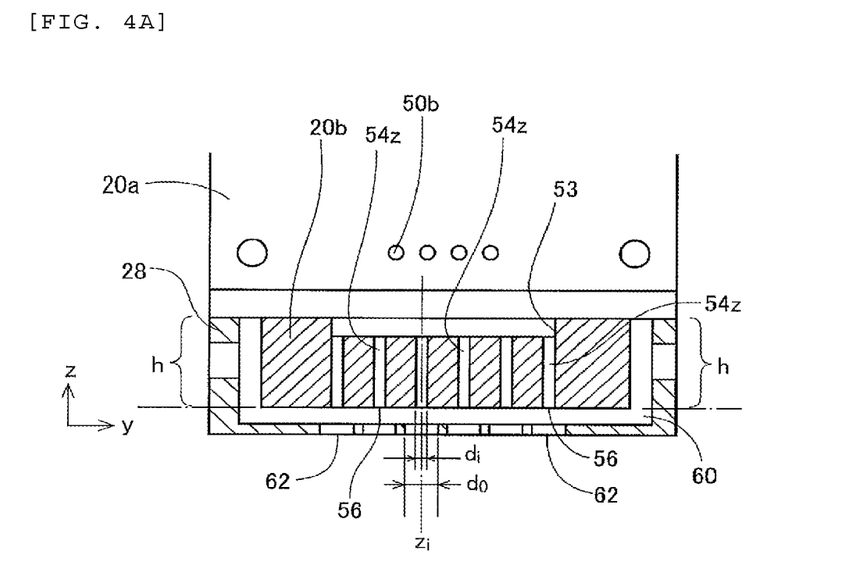
FIG. 4A is a sectional view illustrating a main portion of the plasma gas jetting device.

As described above, in the plasma gas passage 26, the x-passage 50x, the z-passage 50z, the connection recessed section 53, and the ejection passage 54z are connected to each other, one end portion is set as a discharge space side opening 50a that is open to the discharge space 24, the other end portion is set as the inner gas ejection port 56, and activated plasma gas in the discharge space 24 is ejected from the inner gas ejection port 56 through the plasma gas passage 26.

As shown in FIGS. 4A, 6, and the like, the cover section 28 covers the downstream side housing 20b (a part of the inner housing 20) separated with respective gaps in the x-, y-, and z-directions, and is set as a protective gas chamber 60 between the downstream side housing 20b and the cover section 28.

Figure 4B:
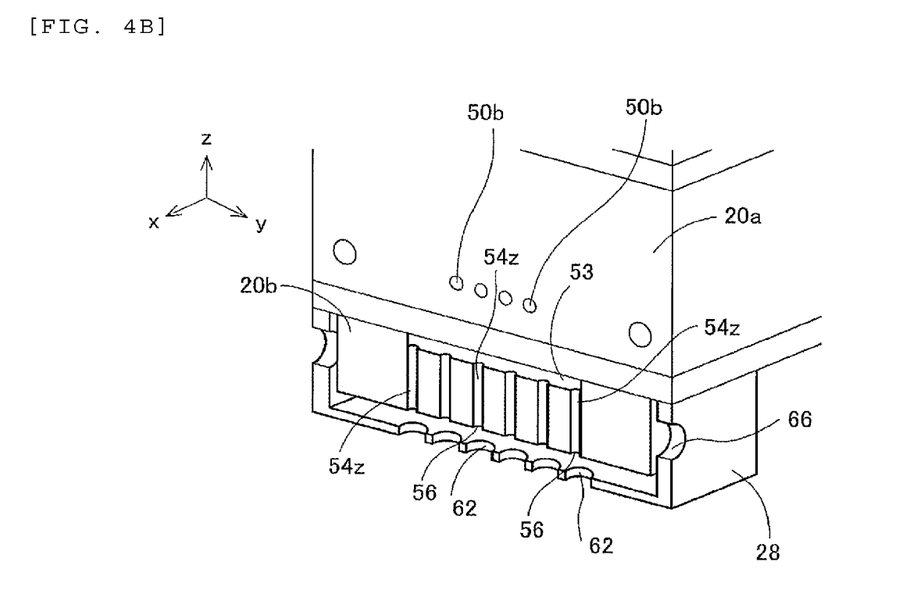
FIG. 4B is a perspective view illustrating the main portion.
Figure 5:
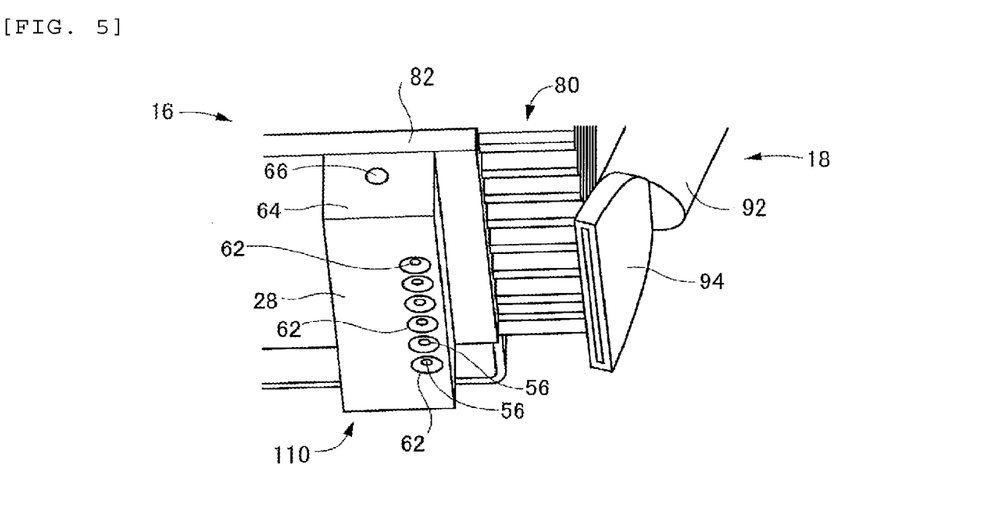
FIG. 5 is a perspective view illustrating a state in which the main portion is viewed from obliquely below.

Six outer gas ejection ports 62 that pass through the z-direction are formed at equal gaps in the y-direction on the bottom face (xy-plane) of the cover section 28. As shown in FIGS. 4A, 4B, 5, and the like, the outer gas ejection ports 62 are also formed to be circular, the concentricity of the inner gas ejection port 56, that is, the center of the inner gas ejection ports 56 and the center of the outer gas ejection ports 62 are formed in a state of being positioned on the same line zi extending in the z-direction. In this manner, the inner gas ejection ports 56 and the outer gas ejection ports 62 are separated from each other in an ejection direction of plasma gas (z-direction in which the ejection passage 54z extends), the outer gas ejection ports 62 are provided on the downstream side of the inner gas ejection ports 56, and the plasma gas that is exhausted from the inner gas ejection ports 56 are ejected externally to the plasma gas jetting device 2 from the outer gas ejection ports 62. In addition, a diameter do of the outer gas ejection ports 62 is larger than a diameter di of the inner gas ejection ports 56. In other words, an opening area So of the outer gas ejection ports 62 is larger than an opening area Si of the inner gas ejection ports 56.

Protective gas supply ports 66 that pass through in the y-direction are respectively formed on both side faces (zx-plane) in a direction in which a pair of side faces 64, that is, the outer gas ejection ports 62 of the cover section 28 are lined up (width direction y). As shown in FIG. 1, a protective gas source 70 is connected via a flow rate adjustment device 72 to the protective gas supply port 66. In the embodiment, protective gas is gas that protects plasma gas from oxygen in the air, and is equivalent to, for example, inert gas such as argon gas and helium gas, nitrogen gas, and the like.

In addition, the protective gas supply port 66 are formed above the inner gas ejection ports 56 in a part (part h of the side face 64) that faces the downstream side housing 20b of the side face 64 of the cover section 28, that is, in the z-direction. In the protective gas supply port 66, the protective gas which is supplied to the protective gas chamber 60 does not disturb the flow of plasma gas that is ejected from the inner gas ejection ports 56, and the protective gas supply port 66 is desirably provided at a position at which it is possible to uniformly supply below the protective gas chamber 60, that is, below the downstream side housing 20b.

Note that, as shown in FIGS. 1 and 2, a heat dissipating section 80 is attached to the front face of the upstream side housing 20a in a state in which the opening 50b of the x-passage 50x is closed. The heat dissipating section 80 has multiple fins. In addition, in FIGS. 3, 4, 6, and the like, reference numeral 82 refers to an earth plate. The earth plate 82 is a constituent element of the upstream side housing 20a, and functions as a lightning rod.

As shown in FIGS. 1, 6, and the like, the heating section 18 is attached in the vicinity of the heat dissipating section 80 on the front face of the upstream side housing 20a. The heating section 18 heats the surface WS of the treatment target object W, heats and jets gas. The heating section 18 includes (a) a main body 90, (b) a heater section 92, (c) a heated gas ejection section 94, and the like. A heating gas supply port 96 is provided on the main body 90, and a heating gas source 98 is connected via a flow rate adjustment device 100. For example, it is possible to use nitrogen gas, inert gas, dry air, and the like as the heating gas.

In addition, as shown in FIG. 6, a heating section 18 is attached in a state in which heated gas is able to be jetted at an angle of θ to a horizontal line.

Note that, in FIG. 1, the treatment gas source 42, the protective gas source 70, and the heating gas source 98 are each individually described, but it is possible for at least a part (for example, a nitrogen gas source, an inert gas source, and the like) to be common.

In the plasma treatment device that is configured as above, the discharge space 24 is formed by applying voltage to the pair of electrodes 22 and 23. An oxygen atom, molecule, and the like that are included in the treatment gas which is supplied to the discharge space 24 is activated and set to a reactive species, but the reactive species is transported using carrier gas. Gas that includes the reactive species that is activated in the discharge space 24 is plasma gas, and is ejected from the inner gas ejection ports 56 through the plasma gas passage 26.

In addition, protective gas (nitrogen gas is used in the embodiment) is supplied from the protective gas supply port 66 in the protective gas chamber 60. Primarily, protective gas contacts the downstream side housing 20b, is moved along the downstream side housing 20b, and is supplied uniformly in a part between the inner gas ejection ports 56 and the outer gas ejection ports 62 of the protective gas supply port 66.

Figure 4C:
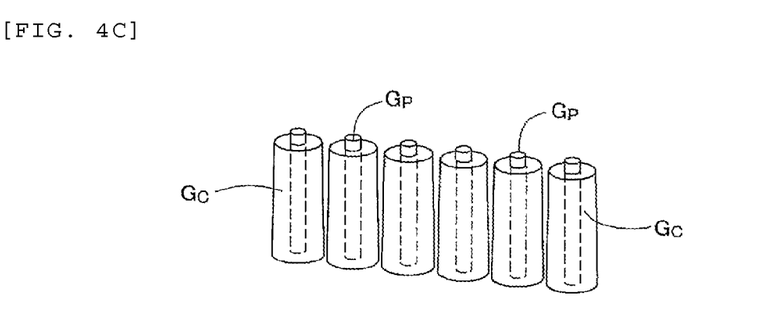
FIG. 4C is a conceptual diagram illustrating an exhaust state of plasma gas and protective gas.

Then, plasma gas is ejected along with protective gas from the outer gas ejection ports 62 by the protective gas that is present in the protective gas chamber 60 coming together with the plasma gas of the inner gas ejection ports 56 as the plasma gas is ejected, and are jetted on the treatment target object W. The periphery of the inner gas ejection ports 56 is caused to reduce pressure by exhausting plasma gas from the inner gas ejection ports 56, and the protective gas in a reduced pressure region, that is, the protective gas in the protective gas chamber 60 comes together with. A principle of a so-called aspirator (Venturi effect) is utilized, and as shown in FIG. 4C, gas is ejected in a state in which the surroundings of plasma gas Gp is surrounded by protective gas Gc. In this case, the entirety of the surroundings of the plasma gas Gp may not be covered by a layer of the protective gas Gc, and it is difficult for the plasma gas Gp to come into contact with oxygen in the air by the protective gas Gc.

Meanwhile, when the plasma gas Gp that is ejected from the plasma gas jetting device comes into contact with the air, there is a problem that the reactive species such as a radical within the plasma gas reacts with oxygen and the like in the air before being jetted to the treatment target object W, and plasma treatment capacity is lowered. In contrast to this, in the plasma gas jetting device 2 of the embodiment, it is difficult for the ejected plasma gas Gp to come into contact with the air. As a result, it is possible to jet plasma gas on the treatment target object in a state in which high treatment capacity is maintained, and it is possible to favorably perform plasma treatment.

From the above, it is possible to consider a configuration of a combined gas ejection section 110 that exhausts combined gas (refers to gas including plasma gas and protective gas surrounding the plasma gas) using the inner gas ejection ports 56 that are provided in the downstream side housing 20b, the outer gas ejection ports 62 that are provided in the cover section 28, and the like. In the embodiment, the combined gas ejection section 110 is attachable to and detachable from the upstream side housing 20a (able to refer to a main body).

In addition, in a plasma treatment device in the related art, since plasma gas that has high treatment capacity is jetted on the treatment target object W, plasma treatment is performed in a state in which the plasma gas jetting device is caused to approach the surface of the treatment target object W. However, it is not possible to cause the plasma gas jetting device to approach the treatment target object W that is a protruding portion on the surface, and it is not possible to favorably perform plasma treatment. In contrast to this, in the plasma gas jetting device 2 of the embodiment, since lowering of treatment capacity of the ejected plasma gas Gp is suppressed, necessity to cause the plasma gas jetting device 2 to approach a surface WS of the treatment target object W is reduced. It is possible to increase a distance H between the outer gas ejection ports 62 and the surface WS of the treatment target object W (referring to FIG. 6, it is possible to refer to height), and it is possible to favorably perform plasma treatment on the treatment target object W that is a protruding portion on the surface WS.

Furthermore, from the related art, a cylindrical cover member made of resin is attached to the periphery of a gas ejection port of the plasma gas jetting device, and is used. However, there is a problem such as attachment of the cylindrical cover being troublesome. In contrast to this, in the plasma gas jetting device 2 of the embodiment, since lowering of treatment capacity of plasma gas is suppressed even if the cylindrical cover member is not attached, it is advantageous in that it is not necessary to attach the cylindrical cover.

In addition, in the plasma treatment device of the embodiment, protective gas is not jetted directly on the treatment target object W, but is jetted after being supplied to the protective gas chamber 60 between the downstream side housing 20b and the cover section 28. Since the vicinity of the downstream side housing 20b is high temperature, the protective gas chamber 60 is also high temperature. Accordingly, prior to the protective gas being jetted on the treatment target object W, it is possible to suppress lowering of the temperature of the treatment target object W caused by jetting of the protective gas, and it is possible to favorably perform plasma treatment.

Furthermore, it is possible to favorably perform plasma treatment using the heating section 18. For example, in a case where the treatment target object W is conveyed in an arrow A direction in FIG. 6, it is possible for plasma gas to be jetted after the treatment target object W is heated by the heating section 18 and to perform plasma treatment at higher capacity. In a case where a conveyance direction of the treatment target object W is an arrow B direction, heated gas is jetted after plasma treatment is performed, but even in this case, it is possible to favorably obtain a plasma treatment effect.

Note that, in the embodiment, as shown in FIG. 6, the plasma gas jetting device 2 is attached in a state in which a distance H between the outer gas ejection ports 62 of the plasma gas generation and ejection section 16 and the surface WS of the treatment target object W, an inclination angle (jetting angle of the heated gas) θ of the heating section 18 (heated gas ejection port 94), and a gap x between a part in which plasma gas is jetted on the treatment target object W and a part in which heated gas is jetted are a desired size.

For example, in a case where the inclination angle θ is small, it is possible for the heated gas that is jetted from the heated gas ejection section 94 to influence the plasma gas Gp and the protective gas Gc that are ejected from the outer gas ejection ports 62, which is undesirable. In addition, in a case where the gap x is long, it is difficult for the effect of heat to be sufficiently obtained, and a possibility for the heated gas to influence the plasma gas or the protective gas increases in a case where the gap x is short. The distance H is desirably increased in a case where concaves and convexes of the surface WS of the treatment target object W are large.

Considering the above circumstances and the like, the distance H, the angle θ, and the gap x are determined. In the heating section 18, it is possible to set a structure in which the gap x from the distance H and the angle θ is uniquely determined, set a structure in which the distance H, the angle θ, and the gap x are able to separately and independently adjusted, and the like.

In addition, the ratio γd (do/di) of the diameter do of the outer gas ejection ports 62 and the diameter di of the inner gas ejection ports 56 is able to be a value that is larger than 1.5 and is smaller than 3.5, and a value larger than 2.0 and smaller than 3.0 is desirable.

In a case where the ratio γd is small, there is resistance when the plasma gas Gp passes through the outer gas ejection ports 62, and it is undesirable for it to be difficult for a layer of the protective gas to be favorably formed. In a case where the ratio γd is large, the necessary amount of protective gas increases, which is undesirable. In addition, the diameter do of the outer gas ejection ports 62 on a structure of the plasma gas jetting device 2 is restricted to openings that are adjacent to each other so as not to overlap with each other.

Considering the conditions above and the like, the ratio γd is designed, the protective gas favorably comes together with the plasma gas Gp, and is in a range in which the layer of the protective gas is favorably formed as shown in FIG. 4C around the plasma gas Gp.

Note that, a relationship between the outer gas ejection ports 62 and the inner gas ejection ports 56 is also able to be represented by the ratio γs (=So/Si) with respect to the opening area So of each of the outer gas ejection ports 62 and the opening area Si of each of the inner gas ejection ports 56.

The ratio γs is able to be a value that is larger than 2 and is smaller than 13, and a value larger than 4 and smaller than 9 is desirable.

In addition, the flow rate and the flow speed of the plasma gas that is ejected from the inner gas ejection ports 56 of the downstream side housing 20b, and the flow rate, the flow speed, and the like of the protective gas that is supplied from the protective gas supply port 66 influence the form of the layer of the plasma gas Gc. For example, in a case where the flow speed of the plasma gas is large, the protective gas more easily comes together with than in a case where the flow speed of the plasma gas is small. In a case where the flow rate and flow speed of the protective gas are too small with respect to the flow rate and flow speed of the plasma gas, it is difficult to favorably form the layer of the protective gas, and in a case where the flow rate and flow speed of the protective gas are too large, the flow rate and flow speed of the protective gas influence exhaust of the plasma gas, which is undesirable. In contrast to this, in a case where the flow rate and the flow speed of the protective gas are in an appropriate range, it is estimated that the layer of the protective gas is favorably formed. Note that, since it is difficult to directly acquire the flow rate and the flow speed of the plasma gas that is ejected from the inner gas ejection ports 56 of the downstream side housing 20b, the flow rate and the flow speed of the treatment gas that is supplied from the treatment gas supply port 40 is equivalent to the flow rate and the flow speed of the plasma gas that is exhausted from the inner gas ejection port 56. In addition, since the opening areas of the inner gas ejection ports 56 are determined, in a case where the flow speed is great, the flow rate is larger than in a case where the flow speed is low.

Figure 7:
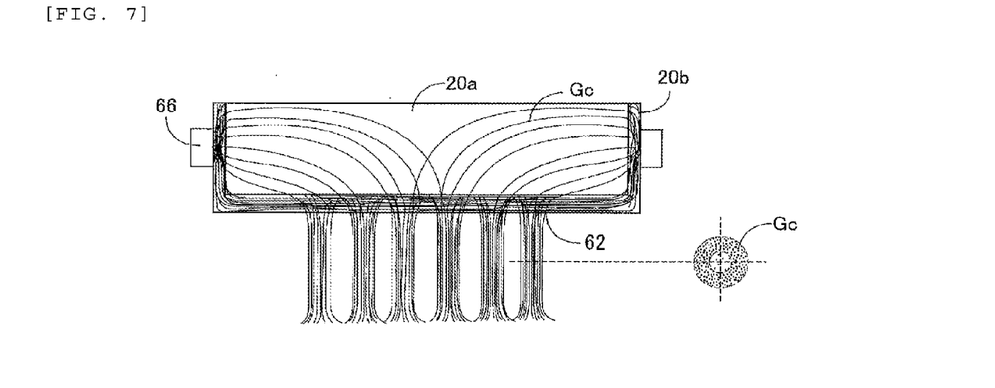
FIG. 7 is a diagram illustrating a result of a state in which plasma gas and protective gas are jetted from the plasma gas jetting device being simulated.

The flow rate of the plasma gas is 30 L/min and the supplied flow rate of the protective gas is 20 L/min, and a result is indicated in FIG. 7 in which flow of the protective gas Gc is simulated in a case where the ratio γd (=do/di) is 3.5/1.2. As shown in FIG. 7, under this condition, it is clear that the layer of the protective gas Gc surrounding the plasma gas Gp is favorably formed and the plasma gas Gp is favorably blocked from the air. In addition, it is recognized that the flow speed of the protective gas Gc is faster externally (downstream side of the outer gas ejection ports 62) than internally to the protective gas chamber 60. It is inferred to cause coming together with the plasma gas Gp as the plasma gas Gp is ejected.

As above, in the embodiment, a plasma gas ejection section is constituted by the treatment gas source 42, the treatment gas supply port 40, the electrodes 22 and 23, the discharge space 24, the plasma gas passage 26, the inner gas ejection ports 56, and the like, and a protective gas supply section is constituted by the protective gas supply port 66, the protective gas source 70, and the like.

Note that, in the embodiment, the pair of electrodes 22 and 23 are provided on the plasma gas jetting device 2, but it is also possible for the plural pairs of electrodes to be provided.

In addition, it is also possible to use inert gas such as helium in addition to nitrogen gas as the protective gas. Furthermore, it is also possible to provide the protective gas supply port 66 in both of both side faces 64 that face the cover section 28 in the y-direction and a pair of yz-planes (front face and back face) that face the x-direction, to provide each of the front face and the rear face two at a time, and the like.

In addition, the cover section 28 may be attachable to and detachable from the downstream side housing 20b, and may be attachable to and detachable from the upstream side housing 20a. Furthermore, the cover section 28 may be provided integrally with the downstream side housing 20b. In addition, it is not essential for the downstream side housing 20b to be attachable to and detachable from the upstream side housing 20a, and the downstream side housing and the upstream side housing 20a may be provided integrally.

Furthermore, there is no restriction on the structure of the plasma gas passage 26. In addition, there is no restriction on the form, number, and the like of the inner gas ejection ports 56 and the outer gas ejection ports 62.

Furthermore, it is not essential to provide the heating section 18. Even if there is no heating section 18, it is possible to favorably suppress lowering of the plasma treatment capacity.

Second Embodiment

Figure 8:
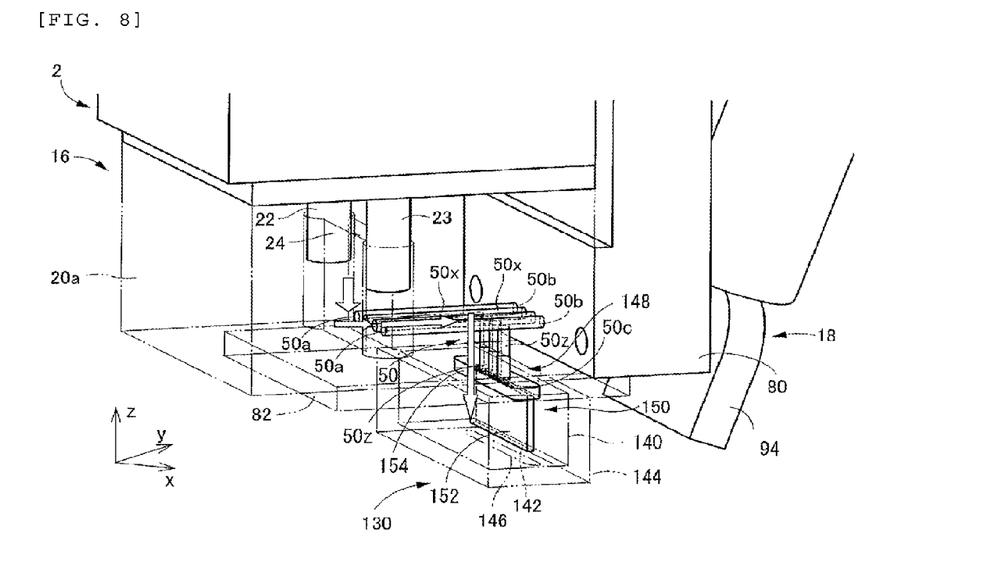
FIG. 8 is a perspective view illustrating a main portion of a plasma gas jetting device of a second embodiment of the disclosure.
Figure 9:
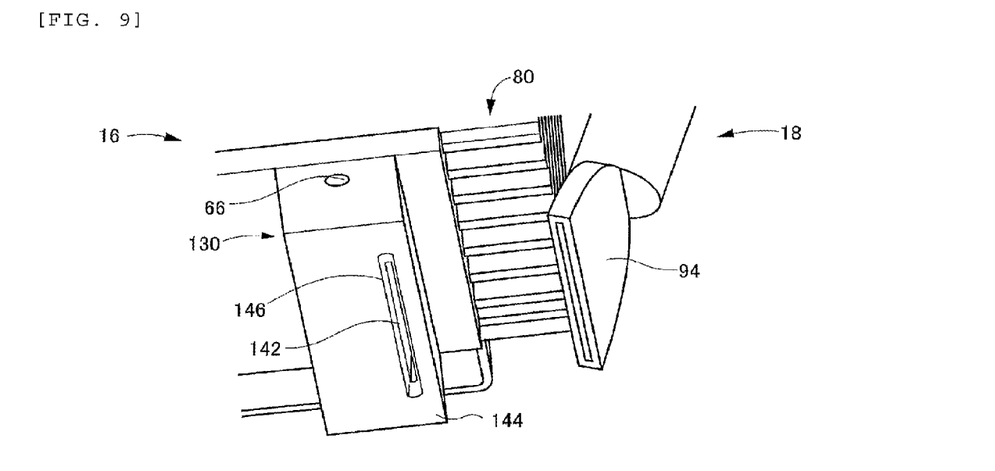
FIG. 9 is a perspective view illustrating a state in which the main portion is viewed from obliquely below.

It is possible to form the combined gas ejection section in the structure indicated in FIGS. 8 and 9. Since parts other than the plasma treatment device are the same as in the first embodiment, description is made using the same reference numerals, and illustration and the like is omitted.

A combined gas ejection section 130 includes (a) one inner gas ejection port 142 that is formed in a downstream side housing 140 and is formed in a long hole shape extending in the y-direction, and (b) one outer gas ejection port 146 that is formed in a cover section 144 and is formed in a long hole shape extending in the y-direction. In addition, a plasma gas passage 148 includes an upstream side passage 50 and a downstream side passage 150 in the same manner as the case in the first embodiment, and the downstream side passage 150 includes an ejection passage 152 that is formed in a long slit shape in the y-direction and a connection recessed section 154. An opening on a lower end side of the ejection passage 152 is set as the inner gas ejection port 142 and an upper end portion is open to a bottom face of the connection recessed section 154. The upstream side passage 50 and the ejection passage 152 are connected via the connection recessed section 154.

In addition, an opening area Sos of the outer gas ejection port 146 is larger than an opening area Sis of the inner gas ejection port 142.

In this manner, it is possible to uniformly jet plasma gas on the treatment target object W in the width direction by forming the ejection port of the plasma gas in a long hole shape extending in the y-direction. In addition, even if the ejection port of the plasma gas is formed in a long hole shape extending in the y-direction, in the same manner, it is possible to form a layer of nitrogen gas on the periphery of the plasma gas and make it difficult for the plasma gas to come into contact with the air.

Third Embodiment

Figure 10:
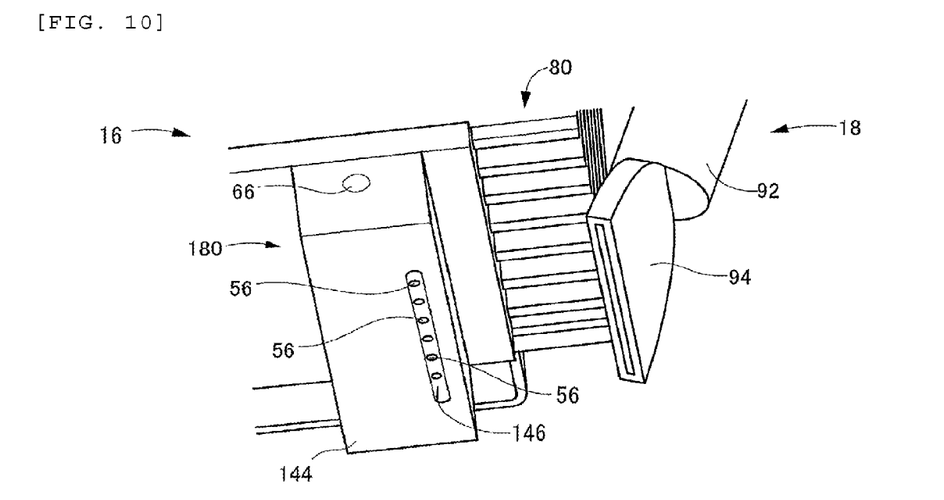
FIG. 10 is a perspective view illustrating a state in which a main portion of a plasma gas jetting device of a third embodiment of the disclosure is viewed from obliquely below.

It is possible to form the combined gas ejection section in the structure indicated in FIG. 10. Since parts other than the plasma treatment device are the same as the plasma treatment device of the first embodiment, description is made using the same reference numerals, and illustration and the like is omitted.

In a combined gas ejection section 180, the cover section 144 that is a constituent element of the plasma treatment device of the second embodiment is attached to the downstream side housing 20b that is a constituent element of the plasma treatment device of the first embodiment, and the combined gas ejection section 180 includes six inner gas ejection ports 56 that are formed in the downstream side housing 20b and one outer gas ejection port 146 that is formed in a long hole shape formed in the cover section 144.

Figure 11:
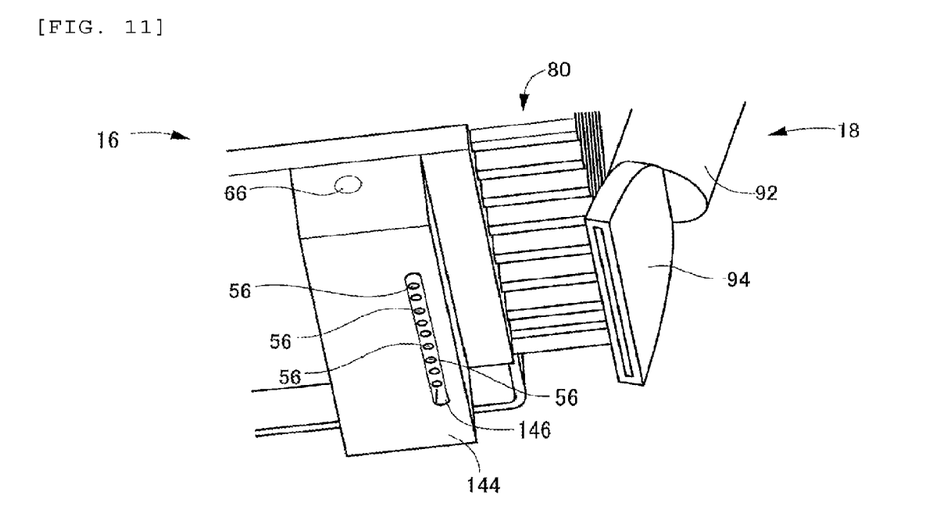
FIG. 11 is a perspective view illustrating a state in which a main portion of a plasma gas jetting device with further improvement is viewed from obliquely below.

Note that, it is also possible to increase the number of ejection passages 54z that are formed in the downstream side housing 20b (seven or more), and as shown in FIG. 11, set the number of the inner gas ejection ports 56 to seven or more. In this manner, it is possible to increase the number of inner gas ejection ports 56 and it is easy to further form the layer of the protective gas by narrowing the gap.

Fourth Embodiment

Figure 12:
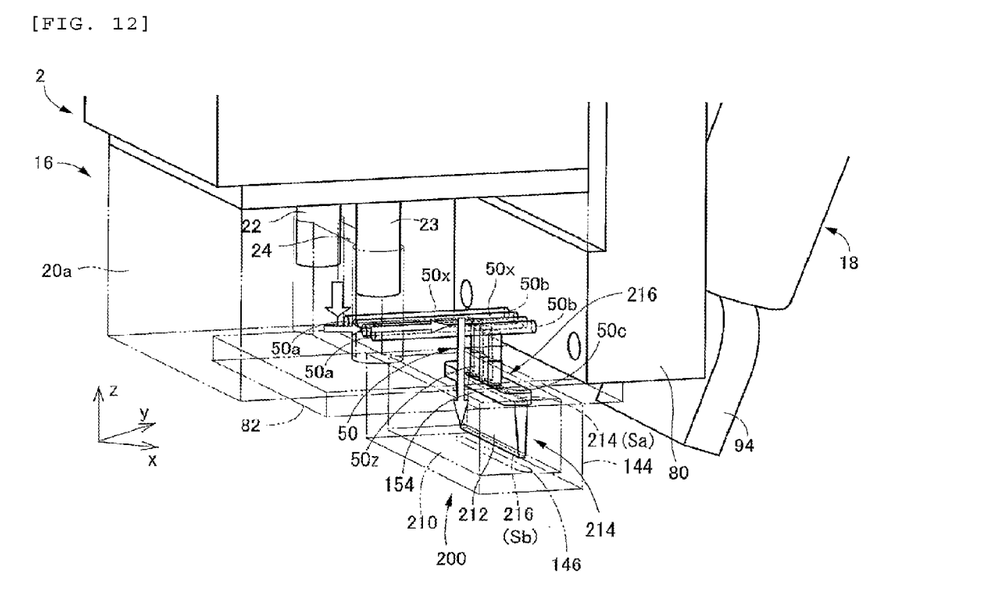
FIG. 12 is a perspective view of a main portion of a plasma gas jetting device of a fourth embodiment of the disclosure.

It is also possible to form the combined gas ejection section in the structure indicated in FIG. 12. Since parts other than the plasma treatment device are the same as the plasma treatment device of the first embodiment, description is made using the same reference numerals, and illustration and the like is omitted.

In a combined gas ejection section 200, in comparison to the combined gas ejection section 130 described in the second embodiment, the shape of the ejection passage is different. An ejection passage 212 with a slit shape that is formed in the downstream side housing 210 is formed to reduce a cross-sectional area from the upstream side toward the downstream side. That is, one of an opening area Sb of an inner gas ejection port 216 that is an opening further on the downstream side than an opening area Sa of an upstream side opening 214 that is open to the connection recessed section 154 becomes smaller (Sb<Sa). As a result, it is possible to increase the flow speed of the plasma gas and it is possible for nitrogen gas to favorably come together with the plasma gas in the vicinity of the inner gas ejection port 216. In the embodiment, the downstream side passage 214 is constituted by the connection recessed section 154, the ejection passage 212, and the like, and the plasma gas passage 216 is constituted by the downstream side passage 214, the upstream side passage 50, and the like.

Note that, it is also possible to apply the technology described in the fourth embodiment to the combined gas ejection sections 110 and 180 in the first and third embodiments. That is, it is possible to shape each of the ejection passages 54z that are formed in the downstream side housing 20b to reduce a cross-sectional area from the upstream side toward the downstream side.

In addition to the multiple embodiments described above, the disclosure is able to be implemented in a state in which various modifications are carried out based on knowledge of a person skilled in the art.

REFERENCE SIGNS LIST

2: PLASMA GAS JETTING DEVICE, 16: PLASMA GENERATION AND EJECTION SECTION, 20: HOUSING, 20a: UPSTREAM SIDE HOUSING, 20b, 140, 210: DOWNSTREAM SIDE HOUSING, 26, 148, 216: PLASMA GAS PASSAGE, 28: COVER, 40: TREATMENT GAS SUPPLY PORT, 42: TREATMENT GAS SOURCE, 50: UPSTREAM SIDE PASSAGE, 52, 150, 216: DOWNSTREAM SIDE PASSAGE, 54z, 152, 212: EJECTION PASSAGE, 56, 142, 216: INNER GAS EJECTION PORT, 62, 146: OUTER GAS EJECTION PORT, 110, 130, 150, 180, 200: COMBINED GAS EJECTION SECTION

The invention claimed is:
1. A plasma gas jetting device comprising:
a plasma gas generation and ejection section including
an inner housing including an upstream side housing and a downstream side housing which is attachable to and detachable from the upstream side housing,
a pair of electrodes,
a discharge space formed between the pair of electrodes,
a plasma gas passage including an upstream side passage formed in the upstream side housing, and a downstream side passage formed in the downstream side housing, and
an outer housing which covers the downstream side housing of the inner housing,
wherein the upstream side passage includes a passage, and a vertical passage extending vertically and connected to the passage, a first end of the upstream side passage being in fluid communication with the discharge space and a second end of the upstream side passage being an opening formed in a lower face of the upstream side housing,
wherein the downstream side passage includes an election passage extending vertically, a first end of the ejection passage being in fluid communication with the second end of the upstream side passage, and a second end of the ejection passage being an inner gas election port formed on a lower face of the downstream side housing and is open towards the outer housing,
wherein the downstream side passage includes a connection section extending horizontally, the connection sec- tion facing the second end of the upstream side passage and the first end of the ejection passage, wherein plasma gas activated in the discharge space is ejected from the inner gas ejection port through the plasma gas passage, wherein a protective gas chamber is formed between the downstream side housing of the inner housing and the outer housing, wherein a protective gas supply section supplies protective gas to the protective gas chamber, wherein an outer gas ejection port is provided on a bottom face of the outer housing, the outer gas ejection port being downstream of and aligned with the inner gas ejection port, and wherein the plasma gas and the protective gas are exhausted from the outer gas ejection port and jetted on a treatment target object.

2. The plasma gas jetting device according to claim 1, wherein an opening area of the outer gas ejection port is larger than an opening area of the inner gas ejection port.

3. The plasma gas jetting device according to claim 1, wherein the protective gas supply section includes at least a pair of protective gas supply ports that are provided in side faces of the outer housing.

4. The plasma gas jetting device according to claim 1, wherein the connection section of the downstream side passage is recessed and open to an upper face of the downstream side housing.

5. The plasma gas jetting device according to claim 1, wherein the inner gas ejection port is concentric with the outer gas ejection port.

6. The plasma gas jetting device according to claim 3, wherein the protective gas supply ports are formed above the inner gas ejection port in the side faces of the outer housing.

7. The plasma gas jetting device according to claim 4, wherein the second end of the upstream side passage is respectively offset the first end of the ejection passage in an X or Y direction, and wherein the second end of the ejection passage is aligned in a lengthwise direction of the outer gas ejection port.

8. A plasma gas jetting device comprising:

a plasma gas generation and ejection section including
an inner housing including an upstream side housing and a downstream side housing which is attachable to and detachable from the upstream side housing,
a pair of electrodes,
a discharge space formed between the pair of electrodes,
a plasma gas passage including an upstream side passage formed in the upstream side housing, and a downstream side passage formed in the downstream side housing, and
an outer housing which covers the downstream side housing of the inner housing, wherein the upstream side passage includes a passage, and a vertical passage extending vertically and connected to the passage, a first end of the upstream side passage being in fluid communication with the discharge space and a second end of the upstream side passage being an opening formed in a lower face of the upstream side housing, wherein the downstream side passage includes an election passage extending vertically, a first end of the ejection passage being in fluid communication with the second end of the upstream side passage, and a second end of the ejection passage being an inner gas election port formed on a lower face of the downstream side housing and is open towards the outer housing, wherein the downstream side passage includes a connection section extending horizontally, the connection section facing the second end of the upstream side passage and the first end of the ejection passage, wherein plasma gas activated in the discharge space is ejected from the inner gas ejection port through the plasma gas passage, wherein a protective gas chamber is formed between the downstream side housing of the inner housing and the outer housing, wherein a protective gas supply section supplies protective gas to the protective gas chamber in a reduced pressure region that is generated by exhaust of the plasma gas, wherein an outer gas election port is provided on a bottom face of the outer housing, the outer gas election port being downstream of and aligned with the inner gas election port, and wherein the plasma gas is ejected along with the protective gas from the outer gas ejection port by the protective gas coming together with the plasma gas as the plasma gas is elected, and jetted on a treatment target object.

* * * * *